(12) United States Patent
Kehrer et al.

(10) Patent No.: US 9,374,042 B2
(45) Date of Patent: Jun. 21, 2016

(54) SYSTEM AND METHOD FOR A LOW NOISE AMPLIFIER

(71) Applicant: Infineon Technologies AG, Neubiberg (DE)

(72) Inventors: Daniel Kehrer, Sauerlach (DE); Paulo Oliveira, Neubiberg (DE); Thomas Leitner, Pregarten (AT)

(73) Assignee: Infineon Technologies AG, Neubiberg (DE)

( * ) Notice: Subject to any disclaimer, the term of this patent is extended or adjusted under 35 U.S.C. 154(b) by 95 days.

(21) Appl. No.: 14/227,479

(22) Filed: Mar. 27, 2014

(65) Prior Publication Data

US 2015/0280654 A1    Oct. 1, 2015

(51) Int. Cl.
| | |
|---|---|
| H04B 1/16 | (2006.01) |
| H03F 1/26 | (2006.01) |
| H03F 1/56 | (2006.01) |
| H03F 3/193 | (2006.01) |
| H04B 1/18 | (2006.01) |
| H03F 3/21 | (2006.01) |

(52) U.S. Cl.
CPC .................. *H03F 1/26* (2013.01); *H03F 1/565* (2013.01); *H03F 3/193* (2013.01); *H03F 3/211* (2013.01); *H04B 1/18* (2013.01); *H03F 2200/111* (2013.01); *H03F 2200/294* (2013.01); *H03F 2200/372* (2013.01); *H03F 2200/451* (2013.01); *H03F 2203/21109* (2013.01); *H03F 2203/21112* (2013.01); *H03F 2203/21136* (2013.01)

(58) Field of Classification Search
CPC .............. H04B 1/16; H04B 1/18; H03F 1/26; H03F 1/193
USPC .................... 455/130, 132, 341, 333
See application file for complete search history.

(56) References Cited

U.S. PATENT DOCUMENTS

| | | | |
|---|---|---|---|
| 5,995,814 A | 11/1999 | Yeh | |
| 7,486,135 B2 * | 2/2009 | Mu ......................... | H03F 1/223 330/283 |
| 7,714,662 B2 | 5/2010 | Jeong et al. | |
| 2009/0088124 A1* | 4/2009 | Schuur .................. | H04B 1/006 455/341 |
| 2010/0164498 A1* | 7/2010 | Helvoort .................. | H03F 3/68 324/322 |
| 2012/0286874 A1 | 11/2012 | Kim et al. | |
| 2013/0251080 A1 | 9/2013 | Dadia | |
| 2013/0316670 A1 | 11/2013 | Tasic et al. | |

FOREIGN PATENT DOCUMENTS

| | | | |
|---|---|---|---|
| KR | 100882103 B1 | 2/2009 | |
| KR | 20130042312 A | 4/2013 | |

* cited by examiner

*Primary Examiner* — Tuan Pham
(74) *Attorney, Agent, or Firm* — Slater Matsil, LLP

(57) ABSTRACT

An embodiment described herein includes a low noise amplifier (LNA) including a plurality of separate input terminals, a plurality of transistors, and an output network coupled to a first reference terminal and a single output of the LNA. Each transistor includes a conduction path and a control terminal coupled to one of the plurality of separate input terminals. The output network is also coupled to the conduction path of each of the plurality of transistors.

25 Claims, 11 Drawing Sheets

SYSTEM AND METHOD FOR A LOW NOISE AMPLIFIER

TECHNICAL FIELD

The present invention relates generally to circuits and amplifiers, and, in particular embodiments, to a system and method for a low noise amplifier (LNA).

BACKGROUND

Electronic devices used with wireless communication systems, such as cellular phones, GPS receivers, and Wi-Fi enabled notebook and tablet computers, generally contain signal processing systems that have interfaces to the analog world. Such interfaces may include wire line and wireless receivers that receive transmitted power and convert the received power to an analog or digital signal that may be demodulated using analog or digital signal processing techniques. A typical wireless receiver architecture includes a low noise amplifier (LNA) that amplifies the very small signals that may be received by an antenna, provides gain to these small signals and passes an amplified signal to later amplification and/or signal processing stages. By providing gain at the LNA, subsequent gain processing stages are made insensitive to noise, thereby enabling a lower system noise figure.

An LNA circuit generally contains at least one transistor and an input matching network. The purpose of the input matching network, which may be made of one or more passive devices such as inductors and capacitors, is to provide an impedance match and/or a noise match to a previous stage, such as an antenna, a filter, an RF switch, or other circuit. LNA implementations may also include an output matching network, a bias network, and other circuit structures such as a cascode transistor.

As wireless RF devices are being used in more environments with more varied specifications, the signal path from antenna system to processing circuit is of increasing importance. Particularly, the placement and usage of LNAs in such varied and demanding systems present varied challenges. Among other things, challenging aspects of designing modern wireless RF devices may include reducing the effects of attenuation, decreasing sensitivity to noise, reducing cost, reducing design time and challenge, and increasing system data rates. These challenges, which often are conflicting or mutually exclusive, present opportunities for improved LNA circuits and system configurations.

SUMMARY OF THE INVENTION

In accordance with an embodiment, a low noise amplifier (LNA) includes a plurality of separate input terminals, a plurality of transistors, and an output network coupled to a first reference terminal and a single output of the LNA. Each transistor includes a conduction path and a control terminal coupled to one of the plurality of separate input terminals. The output network is also coupled to the conduction path of each of the plurality of transistors.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely wireless systems, and more particularly, low noise amplifiers (LNAs) in antenna systems. Some of the various embodiments described herein include antenna systems for mobile communications, multiband communications systems, amplifier circuits, LNA circuits, LNA circuits with matching networks and degeneration elements, and LNAs placed near antenna systems and distant from processing circuits. In other embodiments, aspects may also be applied to other applications involving any type of communication system or amplifier according to any fashion as known in the art.

According to embodiments described herein, an LNA bank including multiple LNAs coupled to a filter bank is disclosed. The filter bank is coupled to an antenna switch and the antenna switch to an antenna system. The antenna switch, filter bank, and LNA bank are cascaded in close proximity to each other in order to reduce attenuation between the circuits. The LNA bank is coupled to an RF chipset via a single coaxial cable and the RF chipset may be disposed more distant from the LNA bank than the LNA bank is from the other components. In some embodiments, the LNAs in the LNA bank may only have a single LNA enabled or selected at a given time. In other embodiments, multiple LNAs in the LNA bank may be enabled of selected simultaneously. In such embodiments, the LNA bank includes a matching network.

Figure 1:
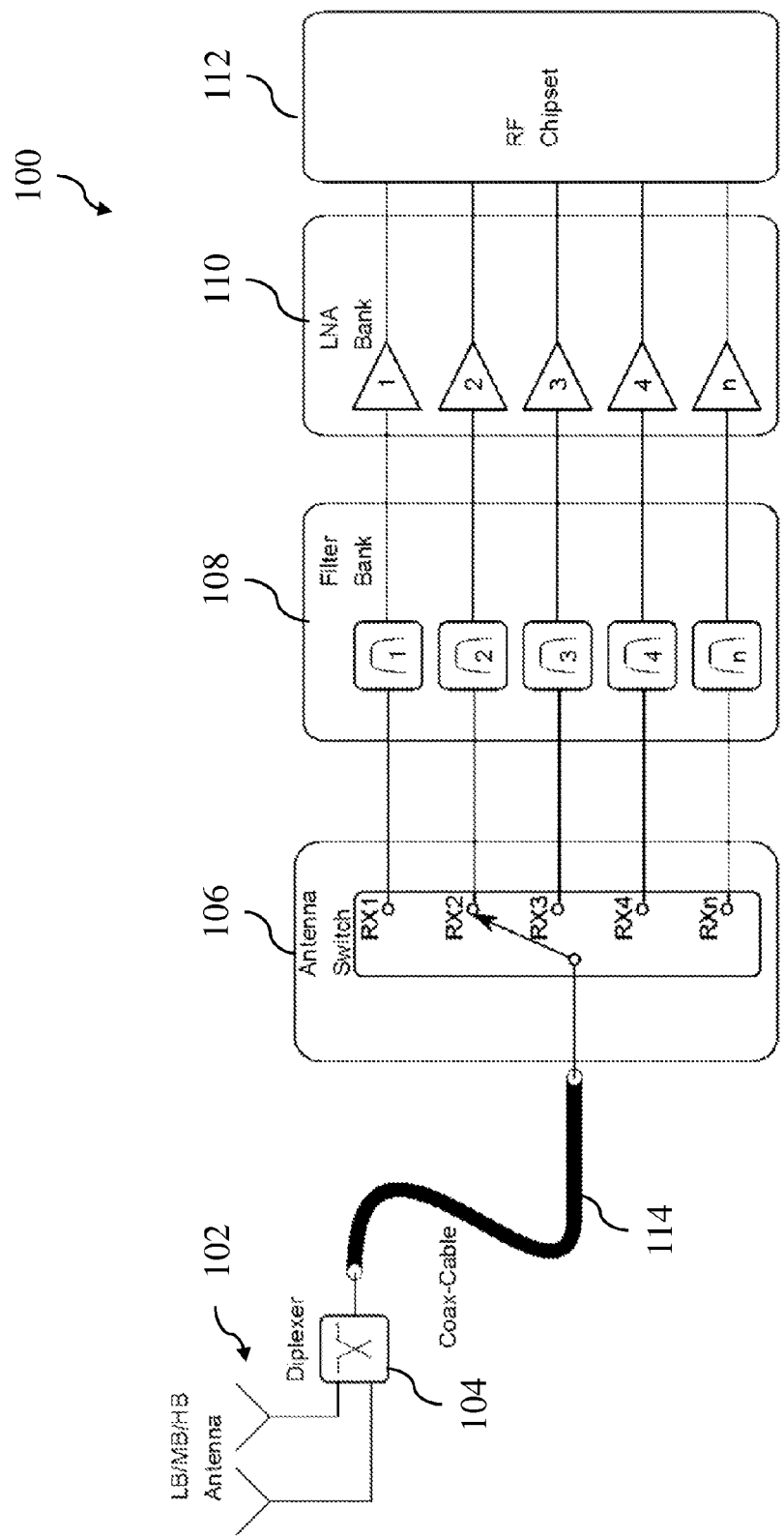
FIG. 1 illustrates a block diagram of a conventional system.

FIG. 1 illustrates a block diagram of a conventional wireless system 100 including antenna system 102, diplexer 104, antenna switch 106, filter bank 108, LNA bank 110, and RF chipset 112. According to the conventional art, antenna system 102 receives signals in different frequency bands, such as low band (LB), mid band (MB), or high band (HB), and multiplexes the signals at diplexer 104 before conveying the signals to antenna switch 106 through coaxial cable 114. Antenna switch 106 selects a switch coupling to supply a specific filter 1-$n$ in filter bank 108. The specific filter 1-$n$ filters and selects a specific frequency band and supplies the filtered signals to an LNA 1-$n$ in LNA bank 110. The specific LNA 1-$n$ supplies amplified signals to RF chipset 112 where more processing may be performed.

As described in brief in the background, attenuation and noise are relevant in electronic systems such as wireless system 100. Increasing the physical distance between each of components 102-112 may increase the attenuation between each stage, thereby degrading the noise performance of the system. Particularly, the coaxial cable 114 coupled between antenna system 102 and antenna switch 104 may cause significant attenuation.

Thus, embodiments described herein include a wireless system with an antenna switch, filter bank, and LNA bank placed in close proximity and configured to be less affected by attenuation and less sensitive to noise. Embodiment wireless systems may include an antenna system with multiple antennas arranged in order to increase signal reception. These antennas may be placed more distant from the RF chipset and may be coupled through a coaxial cable. According to various embodiments, amplification is performed in an LNA bank in close proximity to the antenna switch and prior to the coaxial cable in the signal path of the cascaded circuit. Thus, amplification is performed before more significant attenuation occurs and the overall noise figure is reduced.

Figure 2:
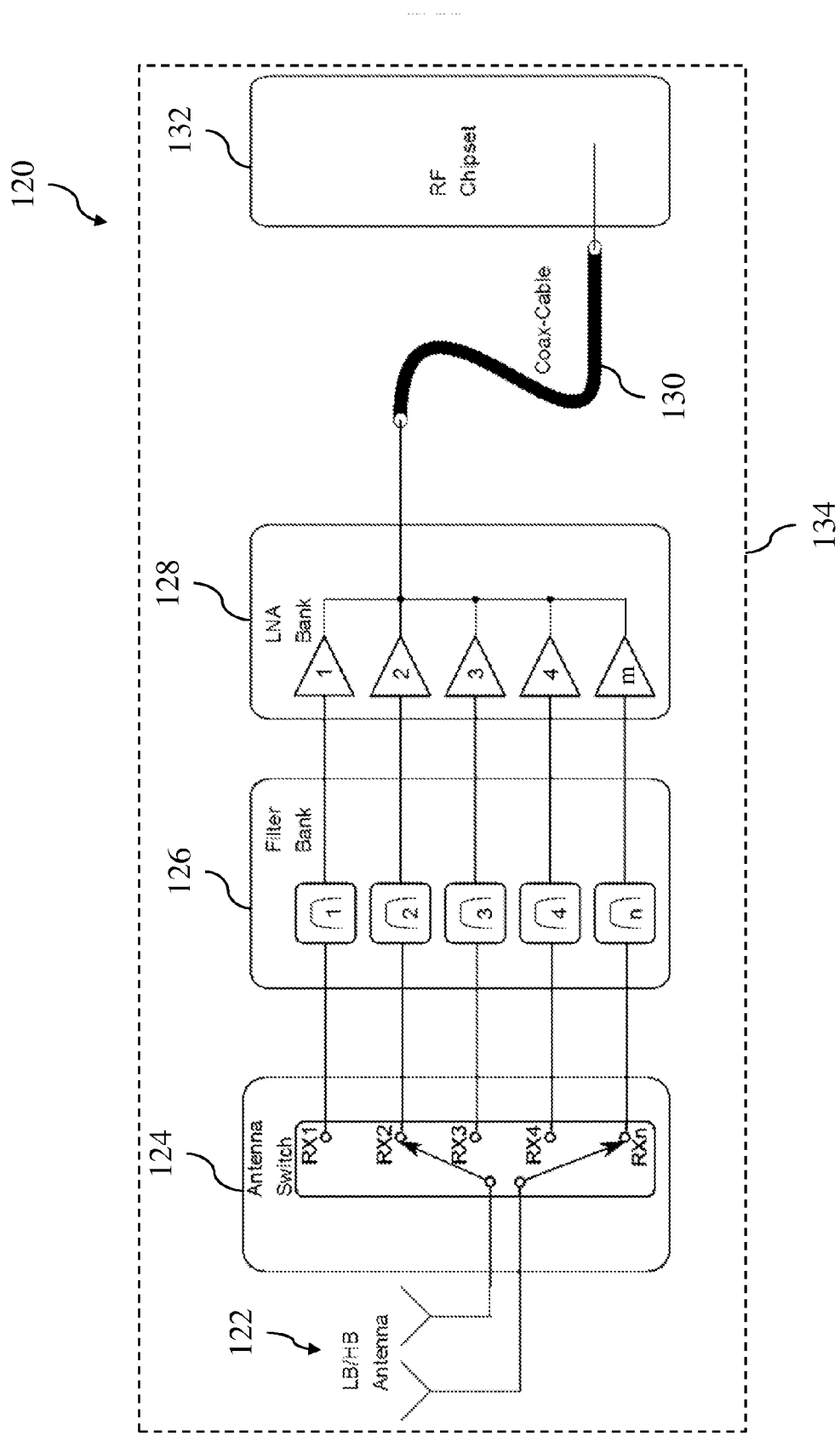
FIG. 2 illustrates a block diagram of an embodiment wireless system.

FIG. 2 illustrates a block diagram of an embodiment wireless system 120 which illustrates the above mentioned aspects and includes antenna system 122, antenna switch 124, filter bank 126, LNA bank 128, and RF chipset 132. According to various embodiments, antenna switch 124, filter bank 126, and LNA bank 128 are placed in close proximity on package 134 and antenna system 122 may also be placed in close proximity or more distant. In some embodiments, antenna switch 124, filter bank 126, and LNA bank 128 placed immediately adjacent to one another. In various embodiments, RF chipset 132 is placed further from LNA bank 128 and coupled to LNA bank 128 via coaxial cable 130. In specific embodiments, antenna system 122 may include a diplexer and an antenna configured to transmit or receive low band (LB) and mid band (MB) signals. In some embodiments, antenna system 122 may include a separate high band (HB) antenna or a separate low band (LB) antenna. Antenna system 122 may also include a combined mid band and high band MB/HB antenna without a diplexer.

According to various embodiments, signals are received at antenna system 122. These signals may include multiple frequency bands. For example, the signals may include a low band (LB) of 700-900 MHz, a mid band (MB) of 1.8-2.4 GHz, and a high band (HB) of 2.5-3.5 GHz. Other embodiments may include more or fewer bands, as is explained further below, and the bands may range across different frequency ranges. Antenna switch 124 is controlled to select specific switch configurations and couple the signals to specific filters of filters 1-$n$ in filter bank 126. LNA bank 128 receives the filtered signals with selected frequency bands from the specific filters in filter bank 126 at corresponding LNAs of LNAs 1-$m$ in LNA bank 128. Further, the received signals are multiplexed at LNA bank 128 and provided on a single output to RF chipset 132 via coaxial cable 130.

Depending on the system requirements or usage environment, various embodiments include numerous variations. For example, antenna system 122 may include multiple antennas.

In other embodiments, antenna system 122 includes a single antenna. Antenna system 122 may include a single tunable antenna or multiple tunable antennas, where each tunable antenna is controlled to transmit and receive specific frequency bands. Antenna switch 124 may include any number of switches. Antenna switch 124 is shown as including two single pole n throw switches, but any configuration is possible. Filter bank 126 includes n filters of any type, such as passive or active filters for any type of band filtering (low pass, band pass, or high pass). In different embodiments, n may range from 1 to any number.

In various embodiments, LNA bank 128 includes m LNAs coupled to filters 1-$n$ in filter bank 126 and to coaxial cable 130. The number m of LNAs in LNA bank 128 may be the same as the number n of filters in filter bank 126 or may be a different number. An LNA in LNA bank 128 may receive inputs from a single filter or multiple filters together. The outputs of LNAs 1-$m$ in LNA bank 128 are multiplexed at the single output and coupled to coaxial cable 130 in order to be conveyed to RF chipset 132. In various embodiments, multiple LNA banks may be combined and multiple coaxial connections may be coupled between RF chipset 132 and the various LNA banks. In such embodiments, each LNA bank includes multiple LNAs multiplexed at a single output. In some embodiments, only a single LNA in LNA bank 128 may be enabled or selected at any given time. In other embodiments, multiple LNAs may be selected or enabled at a given time and the signals may be multiplexed at the output. Generally, different types of embodiment LNAs are used for multiplexing than for other embodiments, as is described further below in reference to the other figures.

Additional components may be included in wireless system 120 that are not shown, such as additional communication systems, diplexers, multiplexers, standalone filters, and processing circuits. According to various embodiments, wireless system 120 is formed on package 134, which may be any type of system. For example, package 134 may be printed circuit board (PCB) in a mobile device, such as a cell phone or tablet computer.

The placement of components including antenna system 122, antenna switch 124, filter bank 126, or LNA bank 128 close together includes various configurations in different embodiments. In some embodiments, the components are placed immediately adjacent to one another, or antenna system 122 may be more distant and antenna switch 124, filter bank 126, and LNA bank 128 are paced immediately adjacent to one another. Specifically, antenna switch 124, filter bank 126, and LNA bank 128 may be placed less than 1 mm apart on package 134 while RF chipset 132 may be placed more than 70 mm away from LNA bank 128. Alternatively, the ratio of distances may be relevant such that the ratio of the distances between LNA bank 128, filter bank 126, and antenna switch 124 to the distance between LNA bank 128 and RF chipset 132 is less than 1:2. In more particular embodiments, the ratio is less than or equal to 1:10. That is to say, RF chipset 132 is ten times or more further from LNA bank 128 than filter bank 126 is from either LNA bank 128 or antenna switch 124. In other embodiments, the components including antenna switch 124, filter bank 126, or LNA bank 128 are placed such that less than 10% of the major dimension of wireless system 120 is between two components. For example, wireless system 120 may be a mobile phone with a long side of 5 inches (12.7 cm), the components are placed such that less than 0.5 inches (1.27 cm) is between two components. In some embodiments, antenna system 122 may also be placed immediately adjacent to antenna switch 124, such as less than 10% of the major dimension of wireless system 120 or with a ratio less than 1:2 compared to the distance between LNA bank 128 and RF chipset 132.

Various LNAs will be described in reference to FIGS. 3-8.

Figure 3:
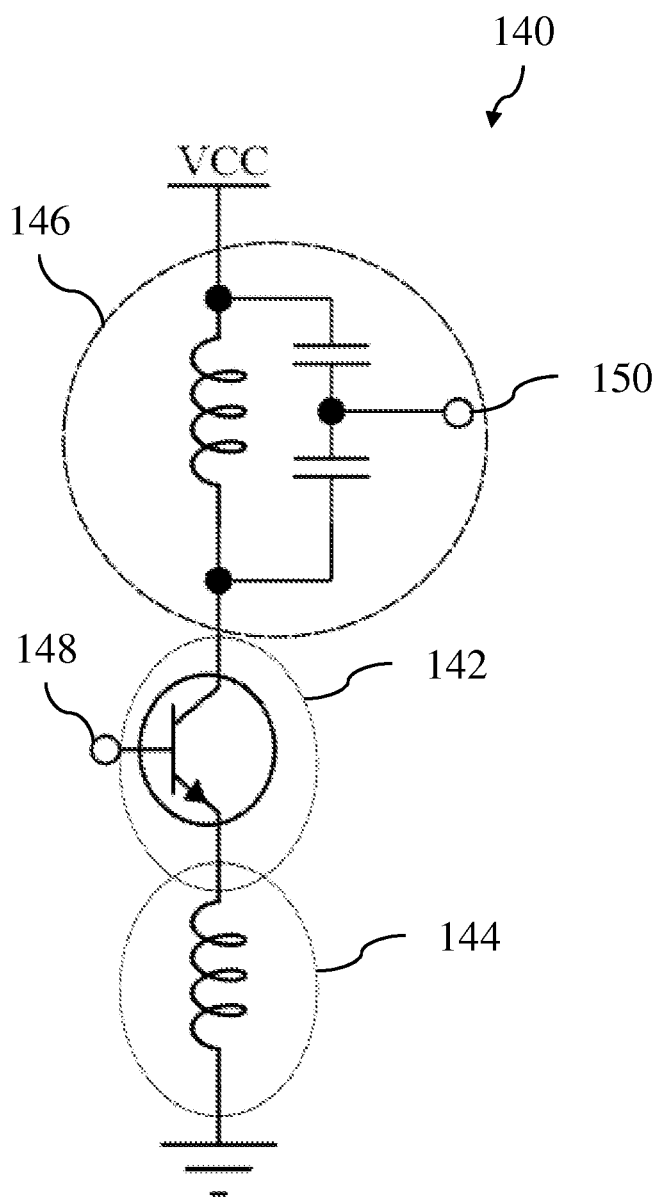
FIG. 3 illustrates a schematic of a conventional low noise amplifier.

FIG. 3 illustrates a schematic of a conventional low noise amplifier (LNA) 140 including amplifying element 142, degeneration element 144, and output tank 146. Amplifying element 142 is connected to an LNA input 148 and provides a current path to output tank 146 that provides output 150. As shown, amplifying element 142 is a bipolar junction transistor (BJT), output tank includes an inductor and two capacitors, and degeneration element 144 is an inductor.

Figure 4:
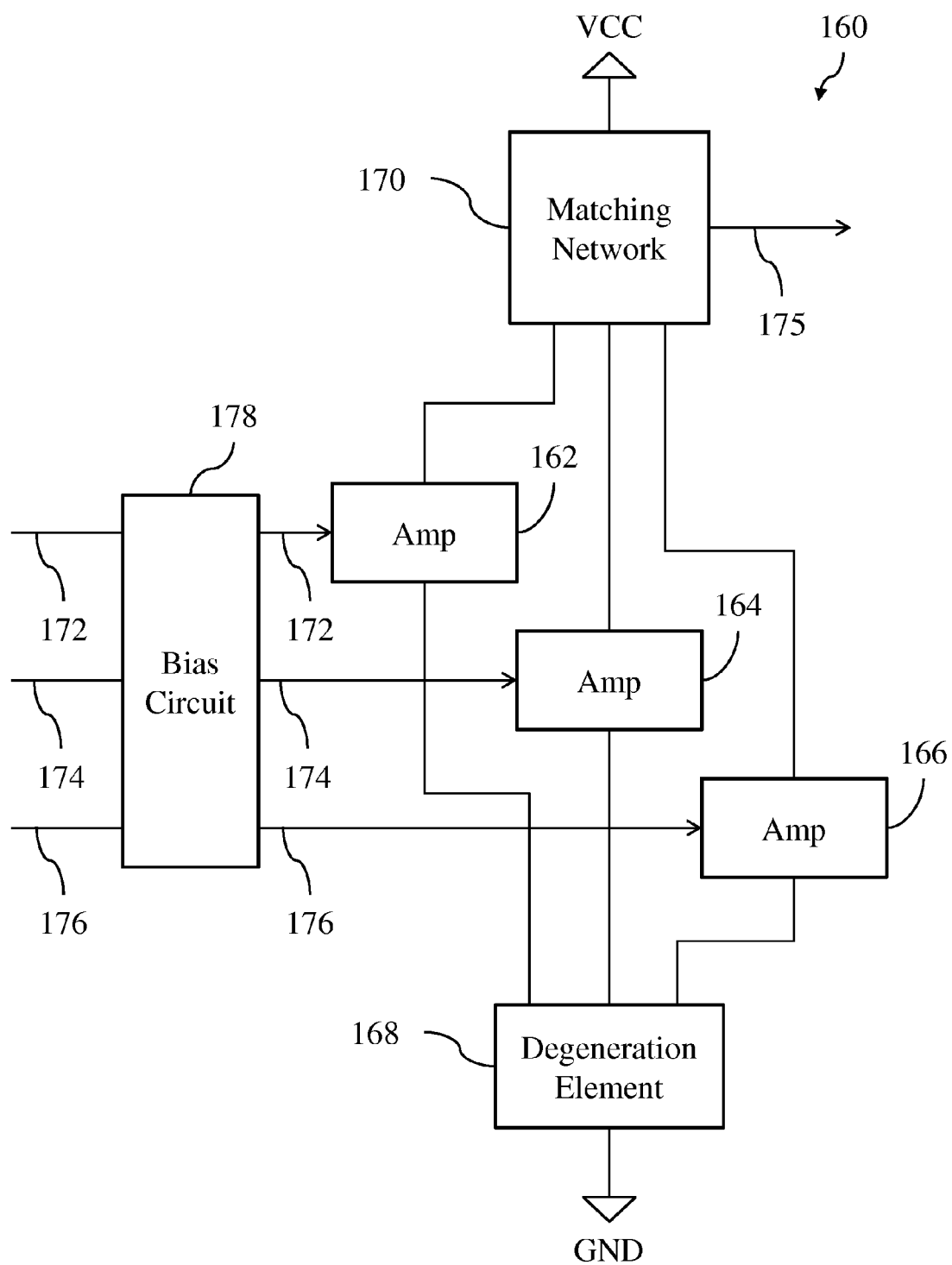
FIG. 4 illustrates a block diagram of an embodiment low noise amplifier system.

FIG. 4 illustrates a block diagram of an embodiment low noise amplifier (LNA) system 160 including amplifiers 162, 164, and 166, degeneration element 168, matching network 170, and bias circuit 178. According to various embodiments, LNA system 160 operates as three LNAs with three separate inputs 172, 174, and 176. Each of inputs 172, 174, and 176 receives a signal from an antenna or filter as discussed in reference to the other figures. The signals are amplified by amplifiers 162, 164, and 166 and provided as output signals through matching network 170 at output 175. Matching network 170 may provide impedance matching on output 175; degeneration element 168 may increase the linearity of and adjust the gain of amplifiers 162, 164, or 166; and bias circuit 178 selects or enables amplifiers 162, 164, or 166. In some embodiments, matching network 170 may include multiple blocks coupled to amplifiers 162, 164, or 166 for impedance matching in specific frequency bands. Likewise, degeneration element 168 may include multiple degeneration elements coupled to amplifiers 162, 164, and 166, such as inductors for example. In some embodiments, bias circuit 178 may select or enable only a single amplifier 162, 164, or 166 at a given time. In other embodiments, bias circuit 178 may select or enable multiple amplifiers at a given time. Specific embodiments are explained in reference to FIGS. 5-8.

Figure 5B:
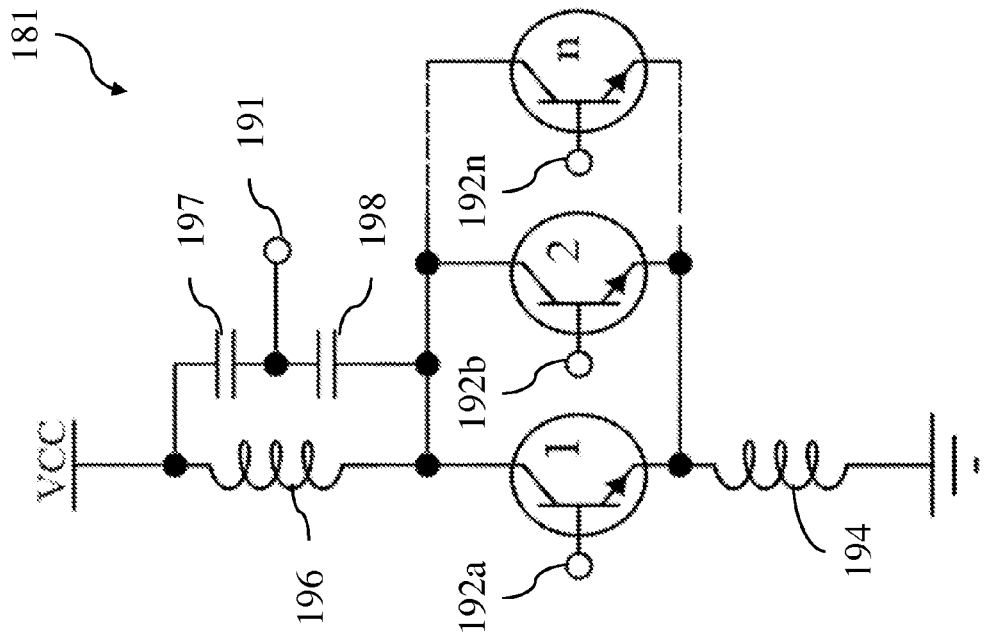
FIGS. 5a and 5b illustrate schematics of embodiment low noise amplifier systems.
Figure 5A:
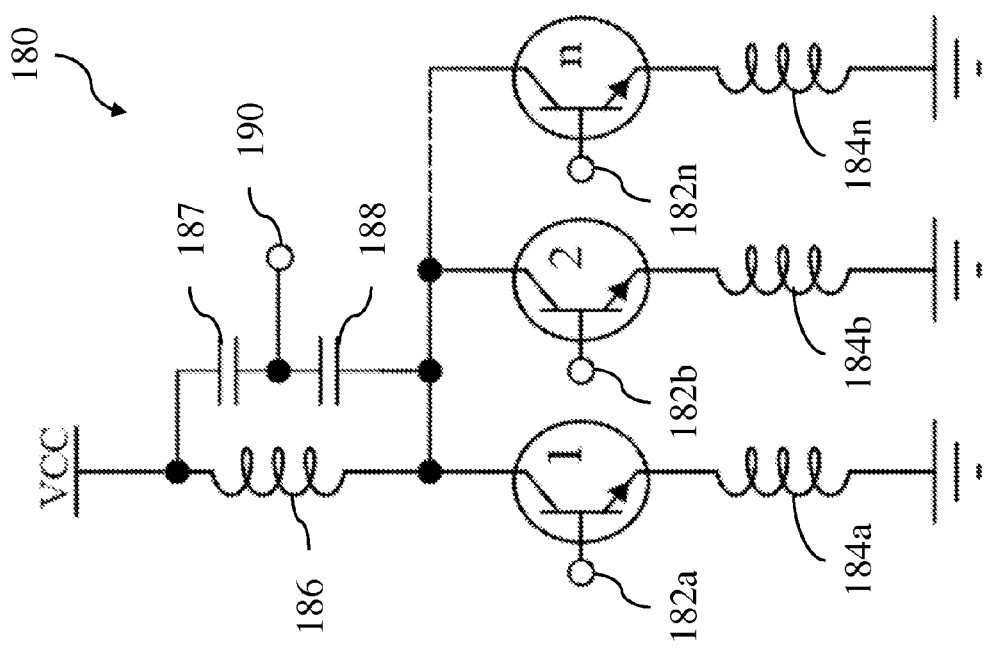

FIGS. 5a and 5b illustrate schematics of embodiment low noise amplifier (LNA) systems 180 and 181, each including an output tank, n amplifiers, and a degeneration element. According to various embodiments, LNA system 180 illustrated in FIG. 5a includes bipolar junction transistors (BJTs) 1-n controlled at a control terminal by inputs 182a-182n, which may be coupled to an antenna system or filter bank as described in reference to the other figures. In LNA system 180, the conduction path of each BJT 1-n is coupled to an individual degeneration element 184a-184n, respectively, that is also coupled to a reference terminal, such as ground. Each degeneration element 184a-184n may be an inductor, for example, or may include other components. Each BJT 1-n is also coupled to an output tank that is coupled to a supply terminal, such as VCC, and includes inductor 186 and capacitors 187 and 188 with output 190 coupled between capacitors 186 and 187. In various embodiments, the output tank may be implemented in other types of configurations with any number of inductors, capacitors, or resistors. In some embodiments, the output tank is not an LC tank, but may include another type of output network that is inductive, resistive, capacitive, or some combination thereof. In an embodiment, LNA system 180 may only have one of transistors 1-n selected or enabled at a time, which may be controlled by a biasing circuit coupled to input 182a-182n, such as bias circuit 178.

According to various embodiments, LNA system 181 illustrated in FIG. 5b includes BJTs 1-n coupled to inputs 192a-192n, an output tank including inductor 196 and capacitors 197 and 198 coupled to output 191, and a single degeneration element 194 that is coupled to the conduction path of each BJT 1-n. The description of LNA system 180 above also applies to LNA system 181 with the exception that degeneration element 194 is a single element coupled to each BJT 1-n.

Figure 6:
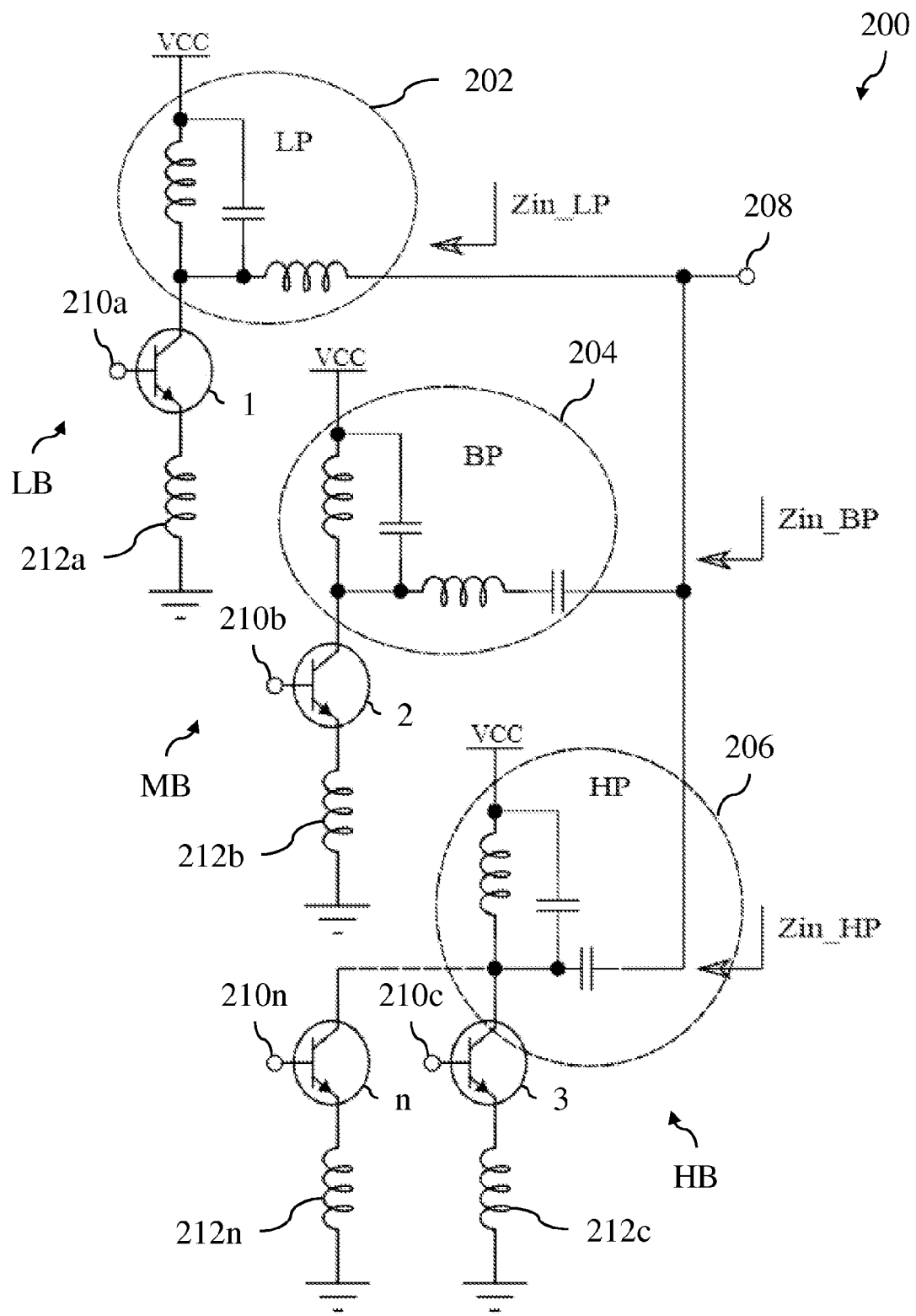
FIG. 6 illustrates a schematic of another embodiment low noise amplifier system.

FIG. 6 illustrates a schematic of another embodiment low noise amplifier (LNA) system 200 including matching networks 202, 204, and 206 coupled through amplification elements to input terminals 210a-210n and to output terminal 208. According to various embodiments, the amplification elements are BJTs 1-n that include conduction paths from matching networks 202, 204, or 206 through a degeneration element 212a-212n to a reference terminal, such as ground, as shown. In various embodiments, the number of transistors 1-n may include any number.

According to various embodiments, each matching network 202, 204, and 206 includes a configuration of capacitors and inductors in order to perform impedance matching for a specific frequency band. Matching network 202 is configured to have a low pass (LP) impedance Zin_LP that is a low impedance matched to the impedance coupled to output terminal 208 for low frequencies. For example, the low band (LB) may include frequencies ranging from 700 to 900 MHz. Similarly, matching network 204 may include inductors and capacitors configured to have a band pass (BP) impedance Zin_BP that is a low impedance matched to the impedance coupled to output terminal 208 for mid band (MB) frequencies. For example, the mid band (MB) may include frequencies ranging from 1.8 to 2.4 GHz. Further, matching network 206 may include inductors and capacitors configured to have a high pass (HP) impedance Zin_HP that is a low impedance matched to the impedance coupled to output terminal 208 for high frequencies. For example, the high band (HB) may include frequencies ranging from 2.5 to 3.5 GHz. In other embodiments, the LB, MB, and HB may include larger or smaller frequency bands. For example, HB may include frequencies ranging above 3.5 GHz.

In the embodiments shown, matching network 202 includes two inductors and a capacitor configured as a low pass filter; matching network 204 includes two inductors and two capacitors configured as a band pass filter; and matching network 206 includes one inductor and two capacitors configured as a high pass filter. When each matching network 202, 204, or 206 is within the respective frequency band LB, MB, or HB, the corresponding impedance Zin_LP, Zin_BP, or Zin_HP is low and matched to an output line coupled to output terminal 208. In cases where each matching network 202, 204, or 206 is outside the respective frequency band LB, MB, or HB (i.e., out of band), the corresponding impedance Zin_LP, Zin_BP, or Zin_HP is high or near an open circuit. Due to this configuration of LNAs, multiple LNAs coupled to output terminal 208 can be operating simultaneously and multiple signals may be multiplexed and conveyed on a single coupling connected to output terminal 208, such as a coaxial cable, for example.

In the various embodiments, each matching network 202, 204, or 206 may include multiple inputs and multiple transistors coupled to a single matching network as shown, for example, with inputs 210c-210n coupled to control terminals of transistors 3-n, which include conduction paths from matching network 206 to reference terminals through degeneration elements 212c-212n. In such embodiments, the transistors may be implemented by coupling transistors in parallel. In some embodiments, only a single transistor coupled to each matching network may be enabled or selected at a time. Any configuration as explained, for example, in reference to FIGS. 5a and 5b in terms of transistor and degeneration element coupling may be applied to LNA system 200. Degeneration elements 212a-212n may include only single inductors as shown. In other embodiments, degeneration elements 212a-212n may include any other combination of circuit elements.

Figure 7:
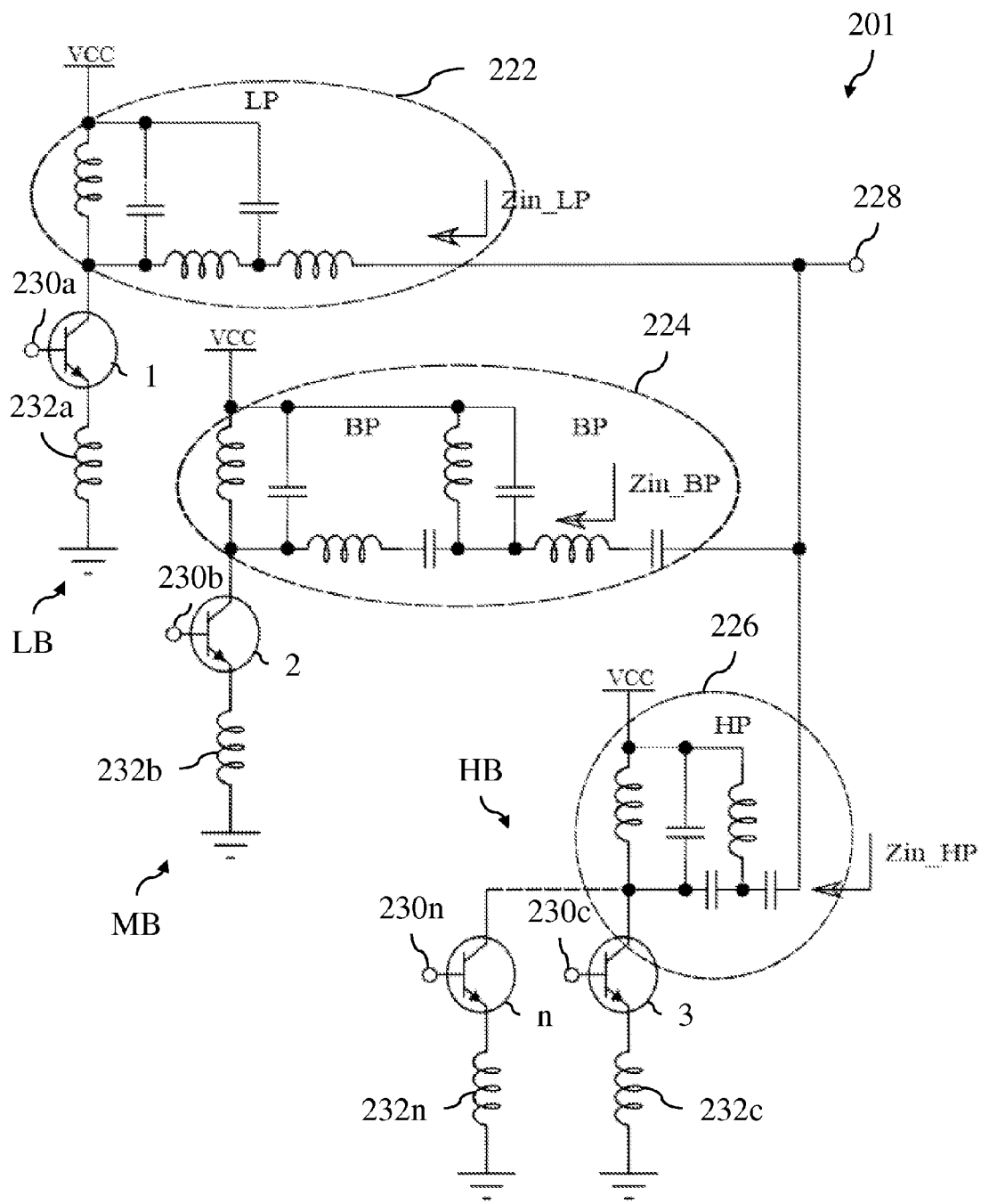
FIG. 7 illustrates a schematic of a further embodiment low noise amplifier system.

FIG. 7 illustrates a schematic of further embodiment low noise amplifier (LNA) system 201 including higher order filters in matching networks 222, 224, and 226. The description of LNA system 201 is similar to the description of LNA system 200 above in reference to FIG. 6. Similar components function in a similar manner.

According to various embodiments, LNA system 201 includes BJTs 1-n with control terminals coupled to inputs 230a-230n and conduction paths from matching network 222, 224, or 226 to a reference terminal via degeneration elements 232a-232n. Matching networks 222, 224, and 226 include higher order filters than matching networks 202, 204, and 206 in FIG. 6. In various embodiments, matching network 222 includes a low pass filter with three inductors and two capacitors, matching network 224 includes a band pass filter with four inductors and four capacitors, and matching network 226 includes a high pass filter with two inductors and three capacitors, as illustrated. The higher order of matching networks 222, 224, and 226 may allow the frequency bands LB, MB, or HB to be more clearly defined by increasing the slope of the gain roll-off outside the respective frequency bands. Other embodiments may include any type of matching network configuration with any number of circuit components.

Figure 8:
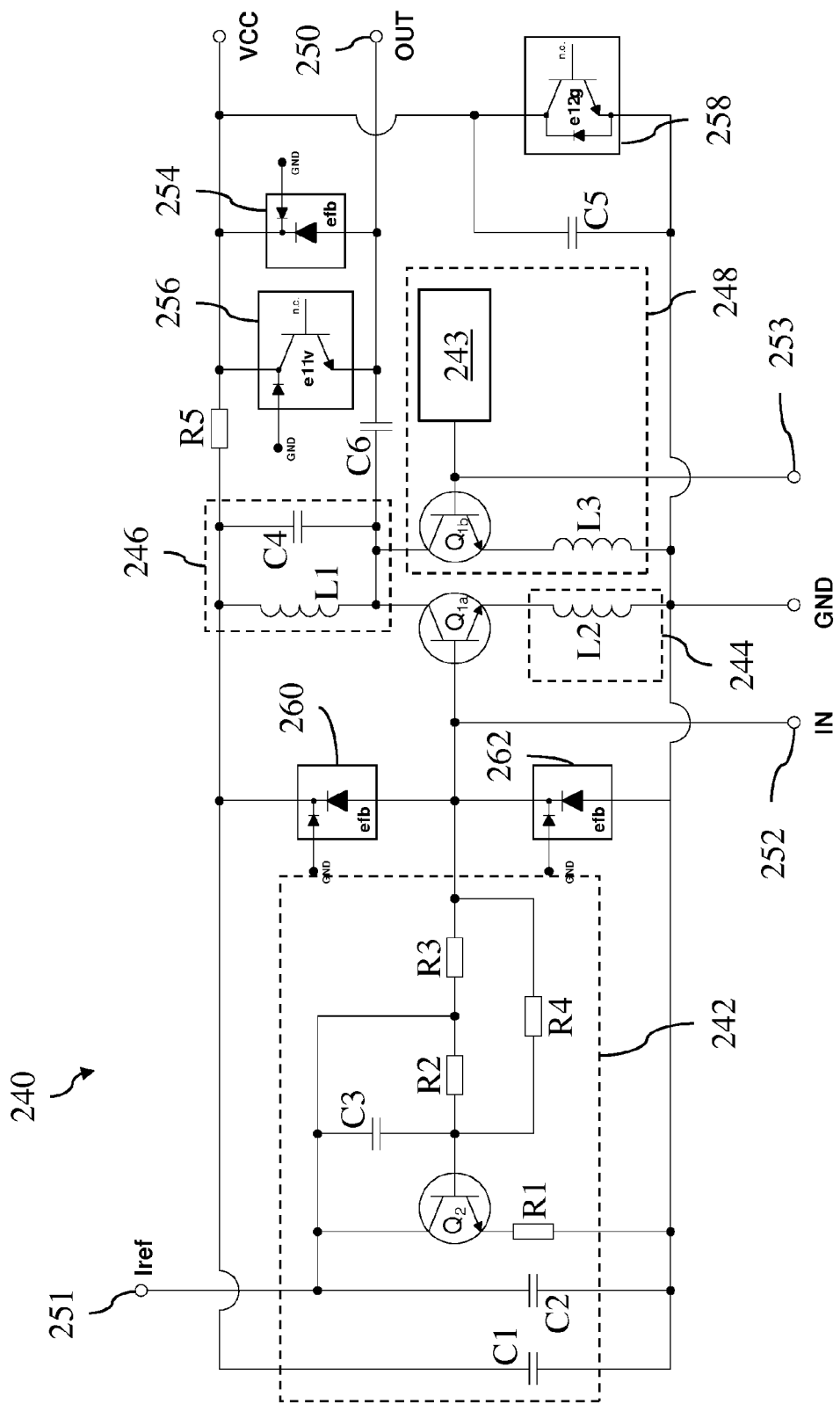
FIG. 8 illustrates a more detailed schematic of a low noise amplifier system.

FIG. 8 illustrates a more detailed schematic of a low noise amplifier (LNA) system 240 including bias circuit 242, degeneration element 244, output tank 246, and BJT Q1a with a control terminal coupled to input 252. According to various embodiments, output tank 246, which may be an implementation of a matching network as described herein, includes inductor L1 and capacitor C4 coupled to output 250; degeneration element 244 includes inductor L2 coupled to a reference such as ground; and bias circuit 242 includes capacitors C1-C3, BJT Q2, and resistors R1-R4. Bias circuit 242 is supplied by a reference current $I_{ref}$ on input 251. In various embodiments, additional LNAs are coupled to output 250 in LNA system 240 as illustrated by LNA 248, which includes input 253 coupled to bias circuit 243 and BJT Q1b, as well as degeneration inductor L3. Other configurations of transistors, output tanks, bias circuits, and degeneration elements are envisioned, as described herein in reference to the other figures.

LNA system 240 may also include resistor R5. In various embodiments, resistor R5 may allow a different supply voltage to be supplied internally in LNA system 240 compared to the supply voltage VCC. LNA system 240 may also include capacitors C5 and C6 as well as diode structures 254, 260, and 262 as well as BJTs 256 and 258 for electrostatic discharge protection (ESD) and voltage clamping. In a specific embodiment, each component has a value according to the following ranges: C1: 5-20 pF, C2: 0-10 pF, C3: 0-10 pF, C4: 0-10 pF, C5: 0-15 pF, C6: 0-10 pF, R1: 10-50Ω, R2: 100-500 kΩ, R3: 10-50 kΩ, R4: 10-50 kΩ, L1: 0-10 nH, L2: 0-10 nH, and L3: 0-10 nH. In a still more specific embodiment, each component has a value according to the following: C1=12.8 pF, C2=1.8 pF, C3=2 pF, C4=2.1 pF, C5=7.2 pF, C6=2.79 pF, R1=26.66Ω, R2=310 kΩ, R3=20 kΩ, R4=20 kΩ, L1=5.2 nH, L2=1.17 nH, and L3=1.1 nH. Any other values are also envisioned for each component.

Generally, in all the figures presented herein, the amplifying elements and/or transistors may be implemented as any type of transistor. For example, transistors described herein may include complementary metal oxide semiconductor (CMOS) transistors, BJTs, gallium arsenide transistors, Fin-FETs, or any other implementation as is known in the art.

Figure 9:
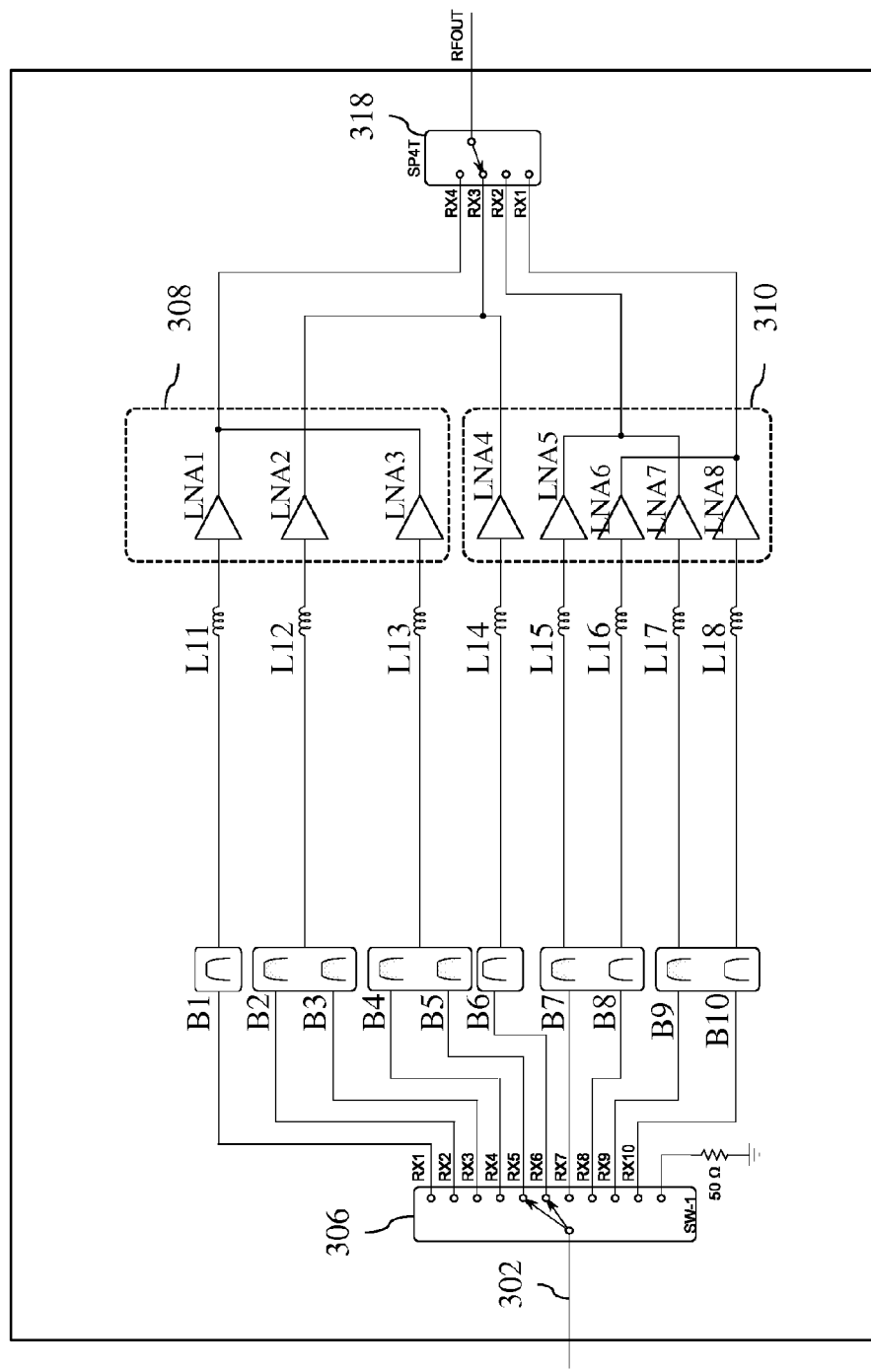
FIG. 9 illustrates a more detailed block diagram of another embodiment wireless system.

FIG. 9 illustrates a more detailed block diagram of another embodiment wireless system 300 including antenna switch 306, filters B1-B10, LNA bank 308, LNA bank 310, and select switch 318. According to various embodiments, inputs are received from an antenna or group of antennas at input 302. The signals received at input 302 are conveyed to antenna switch 306. Antenna switch 306 selects filters B1-B10, which include frequency bands B1-B10. Selected signals from antenna switch 306 are supplied to filters B1-B10 that filter the signals and supply bands B1-B10 to LNAs 1-8 in LNA bank 308 and LNA bank 310 via inductors L11-L18. Outputs of LNA banks 308 and 310 are coupled to select switch 318 that selects one of the signal paths to provide as output RFOUT.

According to various embodiments, LNA banks 308 and 310 include a reduced number of outputs by including LNAs with outputs coupled together and diplexed or multiplexed, as described in reference to the other figures included herein. For example, LNA 1 and LNA 3 have diplexed outputs coupled to terminal RX4 on switch 318, LNA 2 and LNA 3 have diplexed outputs coupled to terminal RX3 on switch 318, LNA 5 and LNA 7 have diplexed outputs coupled to terminal RX2 on switch 318, and LNA 6 and LNA 8 have diplexed outputs coupled to terminal RX1 on switch 318. Outputs of each LNA may also be multiplexed or diplexed using additional components such as a low pass filter or band pass filter. In some embodiments, an LNA bank only has a single common output coupled to the outputs of every LNA in the LNA bank (not shown), as described herein in reference to the other figures.

In various embodiments, band filters B1-B10 may include any frequency band such as low band, mid band, and high band frequencies. In some embodiments, band filters may include frequency bands with frequencies ranging from 100 MHz to 10 GHz with bands as narrow as a 0.01 MHz or as wide as 200 MHz. Other frequency bands may be included in alternative embodiments. In one embodiment, LNA bank 308 is coupled to low band signals and LNA bank 310 is coupled to high band signals.

In some embodiments, wireless system 300 is disposed on a single circuit board 320. The circuit board 320 may be part of a mobile phone or other mobile device. In an embodiment, blocks 308 and 310 are each formed on a separate semiconductor die or circuit board before being packaged in wireless system 300.

Figure 10:
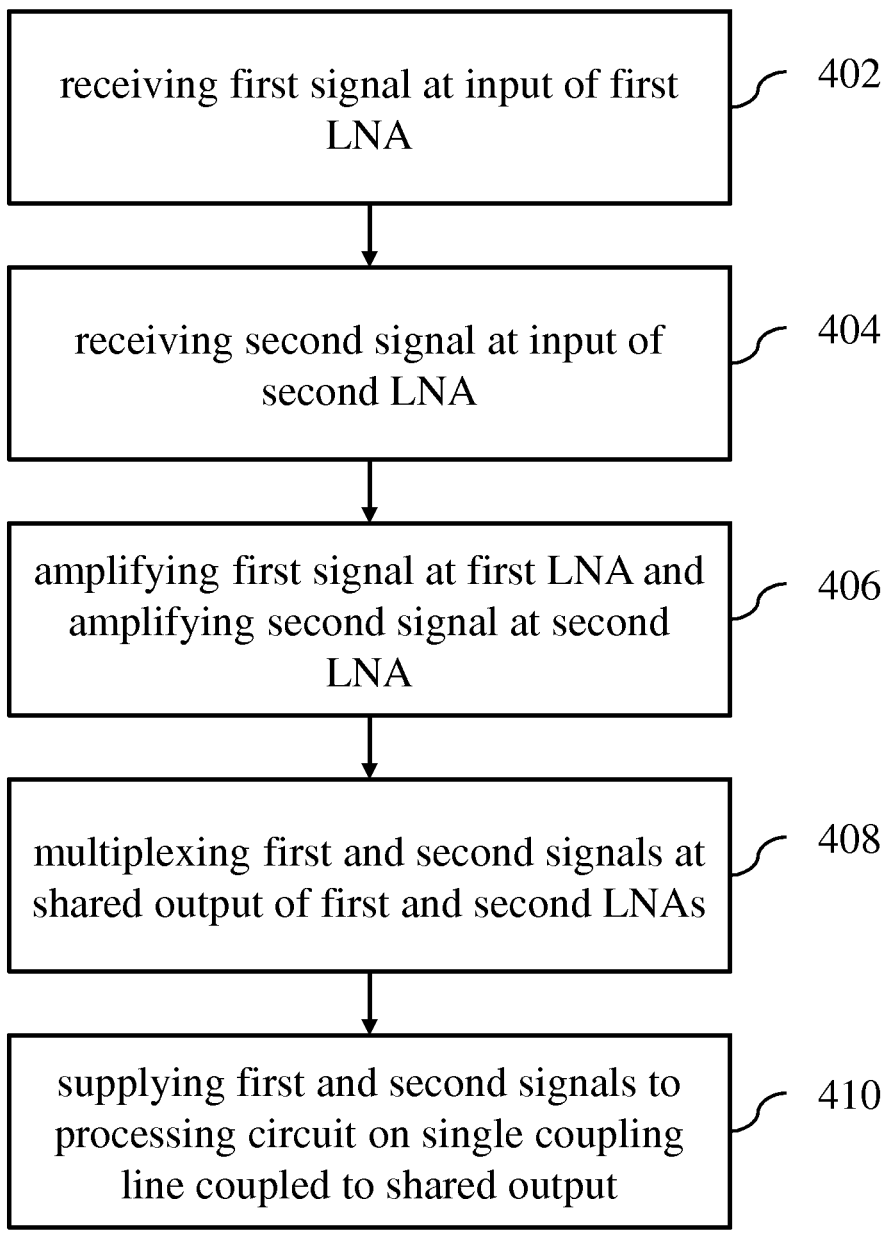
FIG. 10 illustrates a block diagram of an embodiment method of operating a wireless system.

FIG. 10 illustrates a block diagram of an embodiment method of operating a wireless system 400, including steps 402-410, in order to convey a plurality of signals in a plurality of frequency bands. According to various embodiments, step 402 includes receiving a first signal at an input of a first LNA and step 404 includes receiving a second signal at an input of a second LNA. In step 406, the first signal is amplified at the first LNA and the second signal is amplified at the second LNA. The first and second signals are multiplexed at a shared output of the first and second LNAs in step 408. Step 410 includes supplying the first and second signals to a processing circuit on a single coupling line coupled to the shared output. In various embodiments, method of operation 400 may include additional steps and steps 402-410 may be performed in various different orders.

Figure 11:
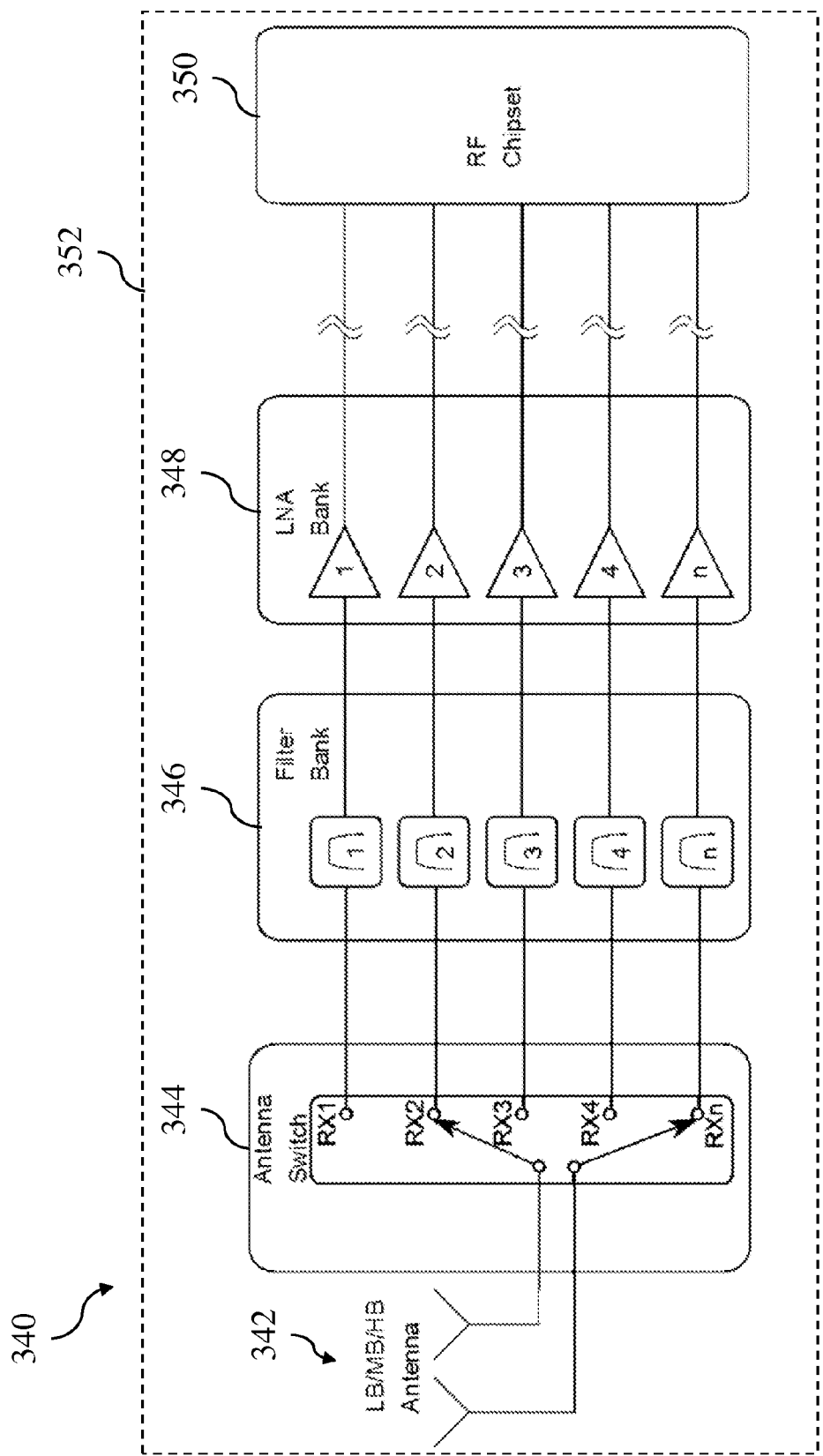
FIG. 11 illustrates a block diagram of an alternative embodiment wireless system.

FIG. 11 illustrates a block diagram of an alternative embodiment wireless system 340 including antenna system 342, antenna switch 344, filter bank 346, LNA bank 348 including LNAs 1-n, and RF chipset 350. In such alternative embodiments, each LNA 1-n includes a separate coupling to RF chipset 350. Wireless system 340 may be included on circuit board 352.

According to various embodiments, a low noise amplifier (LNA) includes a plurality of separate input terminals, a plurality of transistors, and an output network coupled to a first reference terminal and a single output of the LNA. Each transistor includes a conduction path and a control terminal coupled to one of the plurality of separate input terminals. The output network is also coupled to the conduction path of each of the plurality of transistors.

In various embodiments, the LNA includes a plurality of degeneration elements and each degeneration element is coupled between the conduction path of a transistor of the plurality of transistors and a second reference terminal. The LNA may also include a degeneration element coupled between the conduction path of each transistor of the plurality of transistors and a second reference terminal. In some embodiments, the degeneration element is an inductor.

In various embodiments, the output network includes an LC tank. In some embodiments, the output network includes a complex impedance substantially matched to an impedance coupled to the single output of the LNA. The output network may have a first impedance in-band and a second impedance out of band. The second impedance is greater than the first impedance. In one embodiment, the first impedance is substantially matched to an impedance coupled to the single output of the LNA. In various embodiments, the LNA also includes a bias network coupled to the control terminal of each of the plurality of transistors. The bias network is configured to activate one transistor of the plurality of transistors at a time.

According to various embodiments, a low noise amplifier (LNA) bank includes a first LNA and a second LNA. The first LNA includes a first transistor including a control terminal coupled to a first input of the LNA bank and a first output network coupled to a conduction path of the first transistor and an output of the LNA bank. The first output network is configured to have a first type of output impedance in a first frequency band and a second type of output impedance outside the first frequency band. The second LNA includes a second transistor including a control terminal coupled to a second input of the LNA bank and a second output network coupled to a conduction path of the second transistor and the output of the LNA bank. The second output network is configured to have the first type of output impedance in a second frequency band and the second type of output impedance outside the second frequency band.

In various embodiments, the first output network includes a first LC tank and the second output network includes a second LC tank. The LNA bank may also include a third LNA including a third transistor including a control terminal coupled to a third input of the LNA bank and a third output network coupled to a conduction path of the third transistor and the output of the LNA bank. The third output network is configured to have the first type of output impedance in a third frequency band and the second type of output impedance outside the third frequency band. In some embodiments, the first frequency band is a low band, the second frequency band is a mid band, and the third frequency band is a high band. The LNA bank may also include a first degeneration element coupled to the conduction path of the first transistor, a second degeneration element coupled to the conduction path of the second transistor, and a third degeneration element coupled to the conduction path of the third transistor. The first, second, and third degeneration elements may each include an inductor.

In various embodiments, the first or second transistors include a plurality of transistors, each transistor including control terminals coupled to a plurality of separate inputs of the LNA bank and conduction paths coupled to the respective first or second output networks. In some embodiments, the first type of output impedance is substantially matched to an impedance coupled to the output of the LNA bank in respective frequency bands and the second type of output impedance is higher than the first type of output impedance in respective frequency bands. In particular embodiments, the first type of output impedance is 50Ω in respective frequency bands and the second type of output impedance is higher than 200Ω in respective frequency bands.

According to various embodiments, a method includes receiving a first signal at an input of a first low noise amplifier (LNA), receiving a second signal at an input of a second LNA, amplifying the first signal at the first LNA and amplifying the second signal at the second LNA, multiplexing the first and second signals at a shared output line of the first LNA and the second LNA, and supplying the first and second signals to a processing circuit on a single coupling line coupled to the shared output.

In various embodiments, the first LNA, the second LNA, and the shared output line are formed on a single semiconductor die. Receiving the first signal and receiving the second signal may be performed simultaneously and the first and second signals may be supplied to the processing circuit simultaneously. In some embodiments, receiving the first and second signals includes receiving first and second signals from a filter bank that is coupled to an antenna circuit. The filter bank, the first LNA, and the second LNA may be disposed in proximity to one another on a same chip in proportion to a size of the chip. In some specific embodiments, disposed in proximity includes disposed immediately adjacent on a same chip. In other embodiments, disposed in proximity includes disposed within 10% of a longest dimension of the chip. Further, the single coupling line may be a coaxial cable and the processing circuit may be disposed on the same chip distant from the antenna circuit, the filter bank, the first LNA, and the second LNA.

According to various embodiments, a wireless system includes an antenna system, a filter bank coupled to the antenna system, and a low noise amplifier (LNA) bank coupled to the filter bank. The filter bank includes a plurality of filters and each filter in the plurality of filters is coupled to the antenna system. The LNA bank includes a plurality of LNAs coupled to the plurality of filters and to a single output of the LNA bank. The single output of the LNA bank is configured to be coupled to a processing circuit located electrically distant the LNA bank. The antenna system is located within a first distance from the filter bank, the LNA bank is located within the first distance from the filter bank, and the LNA bank is configured to be located within a second distance from the processing circuit.

In various embodiments, the second distance is greater than or equal to 5 times the first distance. The wireless system may also include an antenna switch coupled between the antenna system and the filter bank. The antenna switch includes a plurality of switch outputs and each switch output of the plurality of switch outputs is coupled to a filter in the plurality of filters. In some embodiments, the wireless system includes a mobile communication device disposed on a single circuit board. In such an embodiment, the antenna switch is disposed immediately adjacent to the filter bank and the filter bank is disposed immediately adjacent to the LNA bank. Some embodiments include the processing circuit. The single output of the LNA bank may be coupled to the processing circuit through a coaxial cable.

In various embodiments, the LNA bank also includes a biasing circuit coupled between the plurality of filters and the plurality of LNAs. The biasing circuit is configured to enable a single LNA of the plurality of LNAs at a time. The LNA bank may also include a matching network coupled between the plurality of LNAs and the single output of the LNA bank. The matching network includes a plurality of LC tanks coupled to the plurality of LNAs and each LC tank of the plurality of LC tanks is configured to match an output impedance seen on the single output of the LNA bank in a specific frequency band.

According to various embodiments, a wireless system includes an antenna system, a low noise amplifier (LNA) bank coupled to the antenna system, and a processing circuit coupled to the single output of the LNA bank via a coaxial cable. The LNA bank includes a plurality of LNAs coupled to a single output of the LNA bank and formed on a single semiconductor die. The LNA bank is located within a first distance of the antenna system and the processing circuit is located outside a second distance that is at least 10 times greater than the first distance. In various embodiments, the first distance is 1 mm and the second distance is 70 mm.

According to embodiments of the invention, advantages may include low attenuation between signal sources and processing circuits due to improved LNA placement near the signal source. Other advantages may include reduced routing effort for printed circuit board (PCB) layout and design due to diplexing and multiplexing of outputs for LNAs. In some embodiments, a smaller PCB may be used due to the reduced routing effort. Further advantages include a reduced noise figure and higher sensitivity in some embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An amplifier system including a low noise amplifier (LNA) bank comprising:
   a first LNA comprising:
      a first transistor including a control terminal coupled to a first input of the LNA bank, and
      a first output network coupled to a conduction path of the first transistor and an output of the LNA bank, wherein the first output network is configured to have a first type of output impedance in a first frequency band and a second type of output impedance outside the first frequency band; and
   a second LNA comprising:
      a second transistor including a control terminal coupled to a second input of the LNA bank, and
      a second output network coupled to a conduction path of the second transistor and the output of the LNA bank, wherein the second output network is configured to have the first type of output impedance in a second frequency band and the second type of output impedance outside the second frequency band.

2. The amplifier system of claim 1, wherein the first output network comprises a first LC tank and the second output network comprises a second LC tank.

3. The amplifier system of claim 1, further comprising a third LNA comprising:
   a third transistor including a control terminal coupled to a third input of the LNA bank, and
   a third output network coupled to a conduction path of the third transistor and the output of the LNA bank, wherein the third output network is configured to have the first type of output impedance in a third frequency band and the second type of output impedance outside the third frequency band.

4. The amplifier system of claim 3, wherein:
   the first frequency band is a low band;
   the second frequency band is a mid band; and
   the third frequency band is a high band.

5. The amplifier system of claim 3, further comprising:
   a first degeneration element coupled to the conduction path of the first transistor;
   a second degeneration element coupled to the conduction path of the second transistor; and
   a third degeneration element coupled to the conduction path of the third transistor.

6. The amplifier system of claim 5, wherein the first, second, and third degeneration elements each comprise an inductor.

7. The amplifier system of claim 1, wherein the first or second transistors comprise a plurality of transistors comprising:
   control terminals coupled to a plurality of separate inputs of the LNA bank, and
   conduction paths coupled to the respective first or second output networks.

8. The amplifier system of claim 1, wherein:
   the first type of output impedance is substantially matched to an impedance coupled to the output of the LNA bank in respective frequency bands, and
   the second type of output impedance is higher than the first type of output impedance in respective frequency bands.

9. The amplifier system of claim 1, wherein:
   the first type of output impedance is 50Ω in respective frequency bands, and
   the second type of output impedance is higher than 200Ω in respective frequency bands.

10. The amplifier system of claim 1, further comprising:
   an antenna system;
   a filter bank coupled to the antenna system, wherein the filter bank comprises a plurality of filters and each filter in the plurality of filters is coupled to the antenna system; and
   wherein
      the first LNA is coupled to a first filter in the plurality of filters and the second LNA is coupled to a second filter in the plurality of filters,
      the output of the LNA bank is configured to be coupled to a processing circuit, and
      the antenna system is located within a first distance from the filter bank, the LNA bank is located within the first distance from the filter bank, and the LNA bank is configured to be located within a second distance from the processing circuit.

11. The amplifier system of claim 10, wherein the second distance is greater than or equal to 5 times the first distance.

12. The amplifier system of claim 10, further comprising an antenna switch coupled between the antenna system and the filter bank, wherein the antenna switch comprises a plurality of switch outputs and each switch output of the plurality of switch outputs is coupled to a filter in the plurality of filters.

13. The amplifier system of claim 12, wherein the amplifier system comprises a mobile communication device disposed on a single circuit board, and wherein the antenna switch is disposed immediately adjacent to the filter bank and the filter bank is disposed immediately adjacent to the LNA bank.

14. The amplifier system of claim 10, further comprising the processing circuit.

15. The amplifier system of claim 14, wherein the single output of the LNA bank is coupled to the processing circuit through a coaxial cable.

16. The amplifier system of claim 10, wherein the LNA bank further comprises a biasing circuit coupled between the plurality of filters and the first LNA and the second LNA, and wherein the biasing circuit is configured to enable a single LNA of the LNA bank at a time.

17. The amplifier system of claim 1, further comprising:
an antenna system; and
a processing circuit coupled to the output of the LNA bank via a coaxial cable, wherein the LNA bank is located within a first distance of the antenna system and the processing circuit is located outside a second distance that is at least 10 times greater than the first distance.

18. The amplifier system of claim 17, wherein the first distance is 1 mm and the second distance is 70 mm.

19. A method of operating an amplifier system including a low noise amplifier (LNA) bank, the method comprising:
receiving a first signal at a first input of the LNA bank, the first input of the LNA bank coupled to a first LNA in the LNA bank, the first LNA comprising:
a first transistor including a control terminal coupled to the first input of the LNA bank, and
a first output network coupled to a conduction path of the first transistor and an output of the LNA bank, wherein the first output network is configured to have a first type of output impedance in a first frequency band and a second type of output impedance outside the first frequency band;
receiving a second signal at a second input of the LNA bank, the second input of the LNA bank coupled to a second LNA, the second LNA comprising:
a second transistor including a control terminal coupled to the second input of the LNA bank, and
a second output network coupled to a conduction path of the second transistor and the output of the LNA bank, wherein the second output network is configured to have the first type of output impedance in a second frequency band and the second type of output impedance outside the second frequency band;
amplifying the first signal at the first LNA and amplifying the second signal at the second LNA;
multiplexing the first signal and the second signal at the output of the LNA bank; and
supplying the first signal and the second signal to a processing circuit on a single coupling line coupled to the output of the LNA bank.

20. The method of claim 19, wherein the first LNA, the second LNA, and the output of the LNA bank are formed on a single semiconductor die.

21. The method of claim 19, wherein receiving the first signal and receiving the second signal are performed simultaneously and the first signal and the second signals are supplied to the processing circuit simultaneously.

22. The method of claim 19, wherein receiving the first and second signals comprises receiving first and second signals from a filter bank, the filter bank coupled to an antenna circuit, and wherein the filter bank, the first LNA, and the second LNA are disposed in proximity to one another on a first chip in proportion to a size of the first chip.

23. The method of claim 22, wherein disposed in proximity comprises disposed immediately adjacent on a same chip.

24. The method of claim 22, wherein disposed in proximity comprises disposed within 10% of a longest dimension of the first chip.

25. The method of claim 22, wherein the single coupling line comprises a coaxial cable and the processing circuit is disposed on the first chip distant from the antenna circuit, the filter bank, the first LNA, and the second LNA.

* * * * *